(12) United States Patent
Jaeck et al.

(10) Patent No.: US 6,841,855 B2
(45) Date of Patent: Jan. 11, 2005

(54) ELECTRONIC PACKAGE HAVING A FLEXIBLE SUBSTRATE WITH ENDS CONNECTED TO ONE ANOTHER

(75) Inventors: Edward W. Jaeck, Phoenix, AZ (US); Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/425,383

(22) Filed: Apr. 28, 2003

(65) Prior Publication Data

US 2004/0212063 A1 Oct. 28, 2004

(51) Int. Cl.⁷ .................... H01L 23/48; H01L 23/34; H01L 21/58; H05K 3/02; G05B 15/00
(52) U.S. Cl. .................... 257/668; 257/777; 257/686; 257/685; 257/723; 257/737; 257/738; 257/778; 257/784; 257/786; 361/760; 361/749; 700/1; 700/86; 365/52; 438/107; 438/109; 438/125
(58) Field of Search .................... 257/679, 680, 257/774, 691, 668, 696, 723, 686, 777, 685, 787, 784, 786, 724, 693, 698; 361/749, 398, 400; 365/52, 42; 700/86, 1

(56) References Cited

U.S. PATENT DOCUMENTS

| | | | | |
|---|---|---|---|---|
| 4,781,601 A | * | 11/1988 | Kuhl et al. | 439/77 |
| 5,220,488 A | * | 6/1993 | Denes | 361/749 |
| 5,224,023 A | * | 6/1993 | Smith et al. | 361/784 |
| 5,345,205 A | * | 9/1994 | Kornrumpf | 333/246 |
| 5,448,511 A | * | 9/1995 | Paurus et al. | 365/52 |
| 5,459,641 A | * | 10/1995 | Kuriyama | 361/760 |
| 5,646,446 A | * | 7/1997 | Nicewarner et al. | 257/723 |
| 5,805,422 A | * | 9/1998 | Otake et al. | 361/749 |
| 5,956,234 A | * | 9/1999 | Mueller | 361/767 |
| 6,699,730 B2 | * | 3/2004 | Kim et al. | 438/107 |
| 2001/0006252 A1 | * | 7/2001 | Kim et al. | 257/688 |
| 2002/0050641 A1 | * | 5/2002 | Freeman | 257/737 |
| 2002/0164838 A1 | * | 11/2002 | Moon et al. | 438/107 |
| 2003/0069654 A1 | * | 4/2003 | Larson | 700/86 |
| 2004/0115866 A1 | * | 6/2004 | Bang et al. | 438/125 |
| 2001/0124527 | * | 7/2004 | Chiu | 257/723 |

* cited by examiner

Primary Examiner—Alexander Oscar Williams
(74) Attorney, Agent, or Firm—Blakely, Sokoloff, Taylor & Zafman LLP

(57) ABSTRACT

An electronic package is provided, having a flexible substrate, a first plurality of conductors, and a second plurality of conductors. The flexible substrate has first and second portions with a fold portion between the first and second portions, and is folded at the fold portion to position the second portion over the first portion. Each one of the first plurality of conductors runs from the first portion over the fold portion onto the second portion. Each one of the second plurality of conductors runs from the first portion onto the second portion without running over the fold portion.

22 Claims, 6 Drawing Sheets

ELECTRONIC PACKAGE HAVING A FLEXIBLE SUBSTRATE WITH ENDS CONNECTED TO ONE ANOTHER

BACKGROUND OF THE INVENTION

1). Field of the Invention

This invention relates to an electronic package having a folded, flexible substrate, and to a method of constructing such an electronic package.

2). Discussion of Related Art

Integrated circuits are usually manufactured on semiconductor wafers that are subsequently singulated into individual dies. Such a die may be extremely thin, often less than 100 microns, and is subsequently mounted to a package substrate for purposes of structural integrity. The package substrate also has conductors in the form of traces thereon, metal lines therein and/or vias therein to provide electric interconnection to other devices, often other integrated circuits on other dies.

In order to save space in x and y, it is often required to stack more than one die on top of one another in a z-direction, with the integrated circuits of the dies interconnected with one another. Two dies can, for example, be mounted to a flexible substrate, and the flexible substrate be folded into position such that the dies are above one another. It may also be possible to stack more than two dies on top of one another by folding the flexible substrate at more than one location.

Subsequent integrated circuits in such a stack are interconnected by conductors in the form of traces that run on the flexible substrate across a fold region between the integrated circuits. All the traces run across the fold region. The width of the fold region from a front to a rear side of the flexible substrate thus limits the number of electrical interconnections that can be made.

BRIEF DESCRIPTION OF THE DRAWINGS

The invention is described by way of examples with reference to the accompanying drawings, wherein.

DETAILED DESCRIPTION OF THE INVENTION

Figure 1:
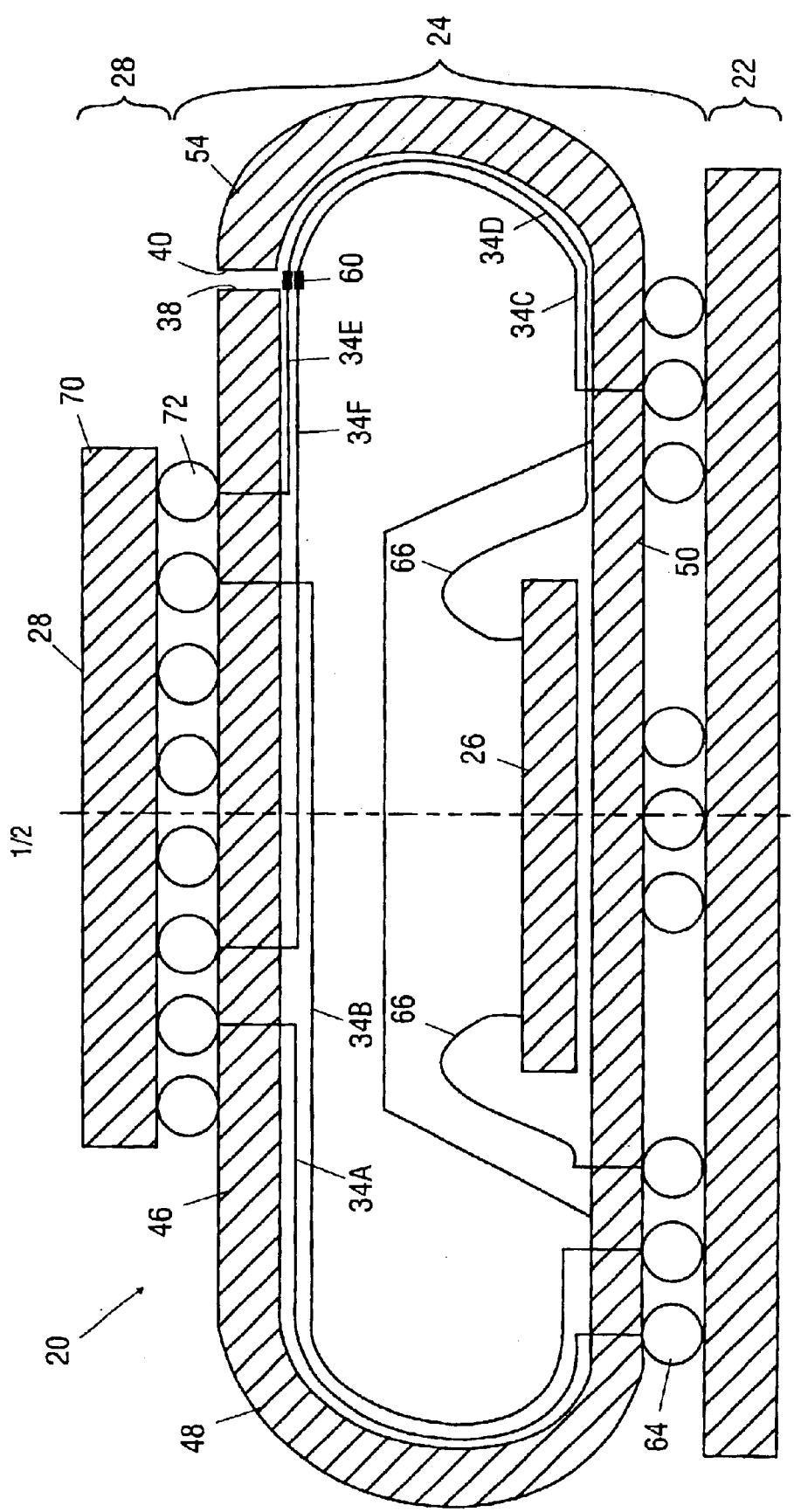
FIG. 1 is a cross-sectional side view of an electronic package, according to an embodiment of the invention.

FIG. 1 of the accompanying drawings illustrates an electronic package 20, according to an embodiment of the invention, including a primary substrate 22, a flexible substrate subassembly 24 mounted and electrically connected to the primary substrate 22, and first and second integrated circuit modules, 26 and 28 respectively, mounted and electrically connected to the flexible substrate subassembly 24 with the second integrated circuit module 28 above the first integrated circuit module 26.

Figure 2:
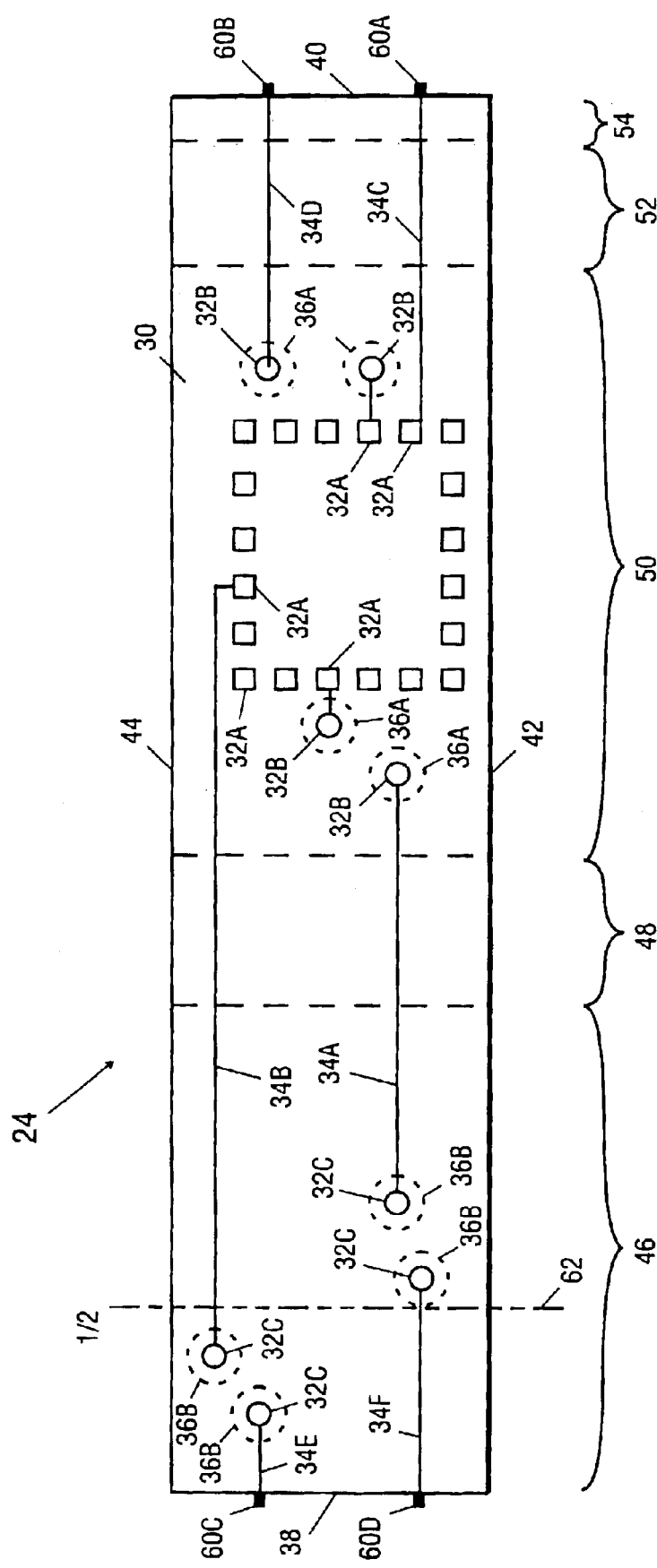
FIG. 2 is a top plan view of a flexible substrate subassembly forming part of the electronic package, illustrating a flexible substrate of the subassembly in an unfolded condition.

FIG. 2 illustrates components of the flexible substrate subassembly 24 before being folded. The flexible substrate subassembly 24 includes a flexible substrate 30, external terminals 32 formed on the flexible substrate 30, electric conductors in the form of traces 34 formed on the flexible substrate 30, and external electric lands 36 formed on a lower surface of the flexible substrate 30.

The flexible substrate 30 is in the form of a strip of nonconductive flexible material having left and right edges 38 and 40 respectively, and front and rear sides 42 and 44 respectively. The flexible substrate 30 has five portions, namely a first mounting portion 50, a left fold portion 48, a second mounting portion 46, a right fold portion 52, and a small end portion 54, sequentially from left to right between the left and right edges 38 and 40. Each portion 46, 48, 50, 52, and 54 extends from the front side 42 to the rear side 44.

Some of the terminals 32A are formed along four edges of a rectangle on the first mounting portion 50. Other ones of the terminals 32B are formed around the terminals 32A on the first mounting portion 50. The terminals 32B are connected through vias in the flexible substrate 30 to corresponding ones of the electric lands 36A formed on an opposing side of the first mounting portion 50.

Further ones of the terminals 32C are formed on the second mounting portion 46. Each one of the terminals 32C is connected through a respective via in the flexible substrate 30 to corresponding ones of the electric lands 36B on an opposing side of the second mounting portion 46.

Some of the traces 34A run from respective ones of the terminals 32B over the left side of the first mounting portion 50, across the left fold portion 48, and over the right side of the second mounting portion 46 to respective ones of the terminals 32C. Further traces 34B run from respective ones of the terminals 32A over the left side of the first mounting portion 50, across the left fold portion 48, and over the right side of the second mounting portion 46 to respective ones of the terminals 32C.

Further ones of the traces 34C run from respective ones of the terminals 32A across a right side of the first mounting portion 50, across the right fold portion 52, and over the end portion 54 to respective locations 60A on the right edge 40. Further ones of the traces 34D run from respective ones of the terminals 32B across a right side of the first mounting portion 50, across the right fold portion 52, and over the end portion 54 to locations 60B on the right edge 40. Further ones of the traces 34E run from respective ones of the terminals 32C across a left side of the second mounting portion 46 to locations 60C on the left edge 38. Yet further ones of the traces 34F run from other ones of the terminals 32C across a left side of the second mounting portion 46 to locations 60D on the left edge 38. The location 60B is at the same distance from front to back as the location 60C, and the location 60A is at the same distance from front to back as the location 60D.

The flexible substrate 30 is folded at the left fold portion 48 so that the second mounting portion 46 is located above and in a plane parallel to the first mounting portion 50. The flexible substrate 30 is also folded at the right fold portion 52 so that the end portion 54 is folded over a right side of the first mounting portion 50. The left edge 38 then meets the right edge 40. The location 60B also meets the location 60C, and the trace 34D is electrically connected to the trace 34E. The location 60A also meets the location 60D, and the trace 34C is connected to the trace 34F.

Electric signals can conduct through the traces 34A and 34B across the fold portion 48 between the second mounting portion 46, now located above the first mounting portion 50, and the first mounting portion 50. The traces 34C, 34D, 34E and 34F thus form conductors that run from the first mounting portion 50 to the second mounting portion 46 without running over the left fold portion 48. Further electric signals can thus conduct between the first mounting portion 50 to the second mounting portion 46, now located above the first mounting portion 50, across the right fold portion 52, between the first mounting portion 50 and the second mounting portion 46, i.e., without conducting across the left fold portion 48. Electric signals can thus conduct to the left and to the right of the first mounting portion 50. This has the advantage that the number of traces 34 that are formed between the front and rear sides 42 and 44 are effectively doubled.

Figure 3:
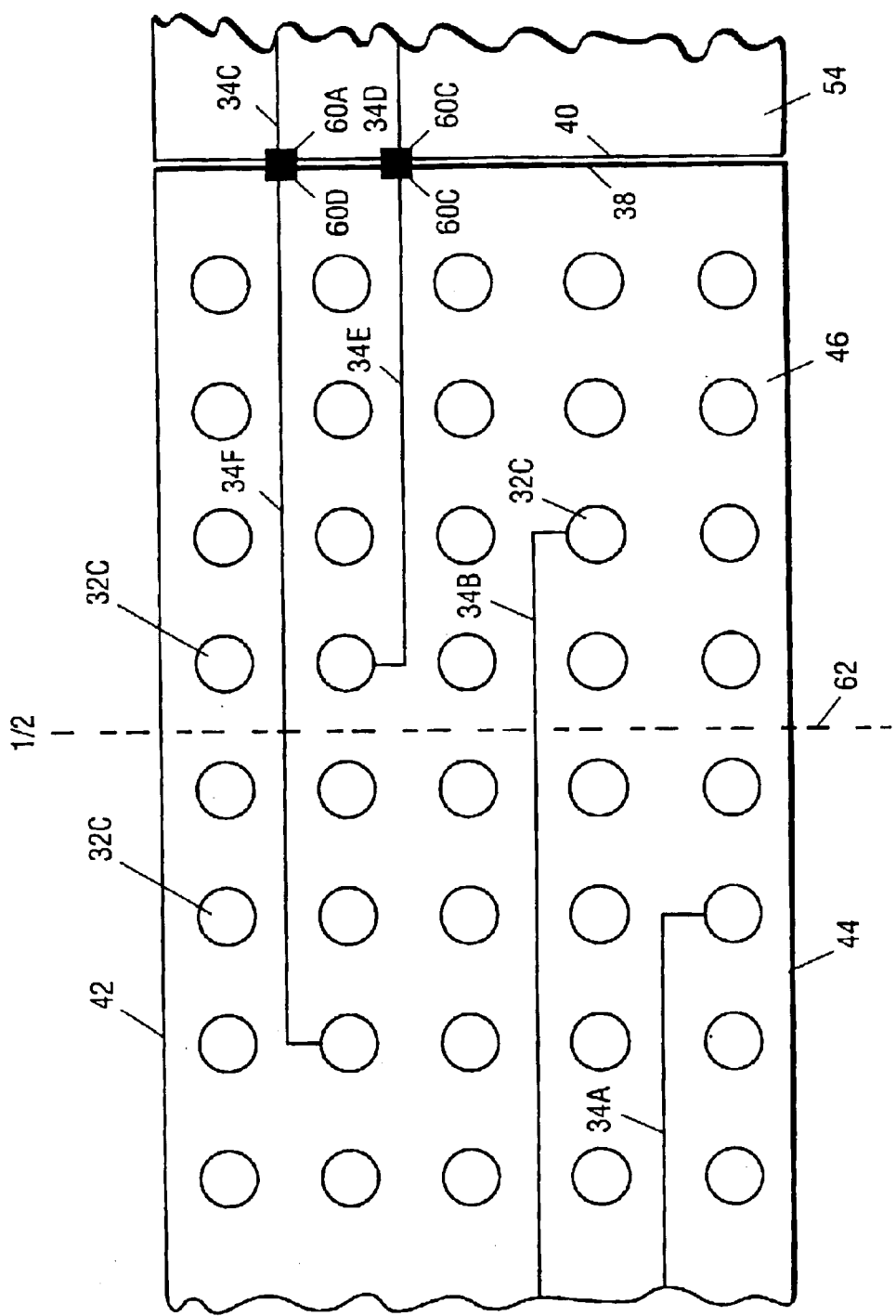
FIG. 3 is a bottom view illustrating interconnection of traces on a second mounting portion with traces on an end portion of the flexible substrate.

A further advantage of connecting the traces 34C to 34F and 34D to 34E at the edges 38 and 40 is illustrated in FIG. 3. The terminals 32C on the second mounting portion 46 are located in an array of rows and columns, the rows being parallel to the front side 42, and the columns being parallel to the left edge 38. The traces 34F extend across a line 62 extending parallel to the columns and dividing the array at the terminals 32 in half. The traces 34B also extend across the line 62. There is thus no particular need to have all the traces 34 on the left of the line 62 extend to the left of the second mounting portion 46, and all the traces 34 on the right of the line 62 extend to the right of the second mounting portion 46. Such a feature allows for optimization in layout, or may be used to engineer electrical delay.

Reference is now made to FIGS. 1 and 2 in combination. The flexible substrate subassembly 24 further has a plurality of contacts in the form of solder balls 64, each attached to a respective one of the electric lands 36A. The first integrated circuit module 26 is typically a processor, and is mounted to an upper surface of the first mounting portion 50 before the flexible substrate 30 is folded. The first integrated circuit module 26 is also electrically connected, typically by wirebonding 66, to respective ones of the terminals 32A. The solder balls 64 are mounted to corresponding contacts on the primary substrate 22. Electric signals can conduct between the primary substrate 22 through the solder balls 64, the vias in the first mounting portion 50, the terminals 34B and 34A, and the wirebonding 66 to and from the first integrated circuit module 26.

The second integrated circuit module 28 includes an integrated circuit 70 and a plurality of electric contacts represented in this embodiment as solder contacts 72 attached to a lower surface of the integrated circuit 70. The integrated circuit 70 is typically a memory module. The solder contacts 72 are located on and attached to respective ones of the electric lands 36B. Electric signals can conduct between the integrated circuit 70, the solder contacts 72, the vias in the second mounting portion 46, the terminals 32C, and the traces 34A–F to and from the first mounting portion 50, from where they can be routed either to the first integrated circuit module 26 or directly to the solder balls 64.

Figure 4:
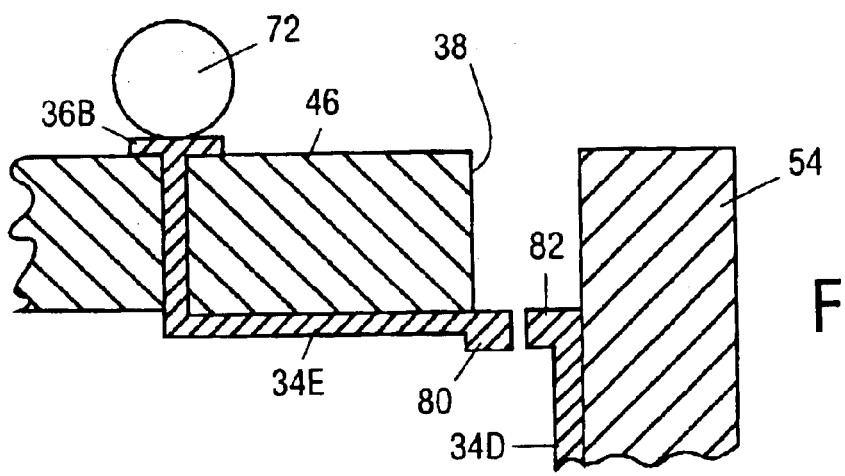
FIG. 4 is a cross-sectional side view illustrating interconnection of one trace on the second mounting portion to one trace on the end portion, according to one embodiment of the invention.

FIG. 4 illustrates one manner in which, for example, the trace 34D can be connected to the trace 34E. The end portion 54 extends upward so that the right edge 40 is now located approximately in the same plane as the upper surface of the second mounting portion 46 on which the electric lands 36B are located. Solder formations 80 and 82 are formed on the second mounting portion 46 and the end portion 54, respectively. The solder formation 80 is located at the left edge 38, and the solder formation 82 is spaced from the right edge 40 by a distance approximately equal to a thickness of the second mounting portion 46. The solder formations 80 and 82 are located against one another and bonded to one another in a thermal process. Ultrasonic bonding may be used instead of a thermal process.

Figure 5:
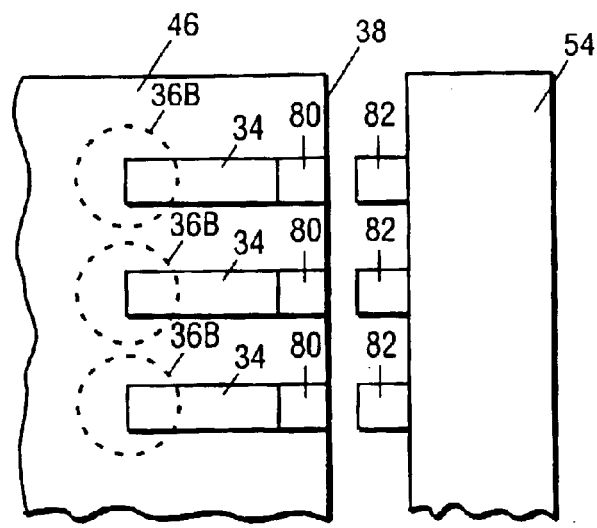
FIG. 5 is a bottom view illustrating interconnection of more traces according to the embodiment of FIG. 4.

As illustrated in FIG. 5, each one of the traces 34 extending to the left edge 38 may have a respective solder formation 80 at the left edge 38 connected to a respective solder formation 82 on the end portion 54. In such a manner, individual ones of the traces 34 on the second mounting portion 46 and the end portion 54 can be individually connected to one another, i.e., without interconnection to one another.

Figure 6:
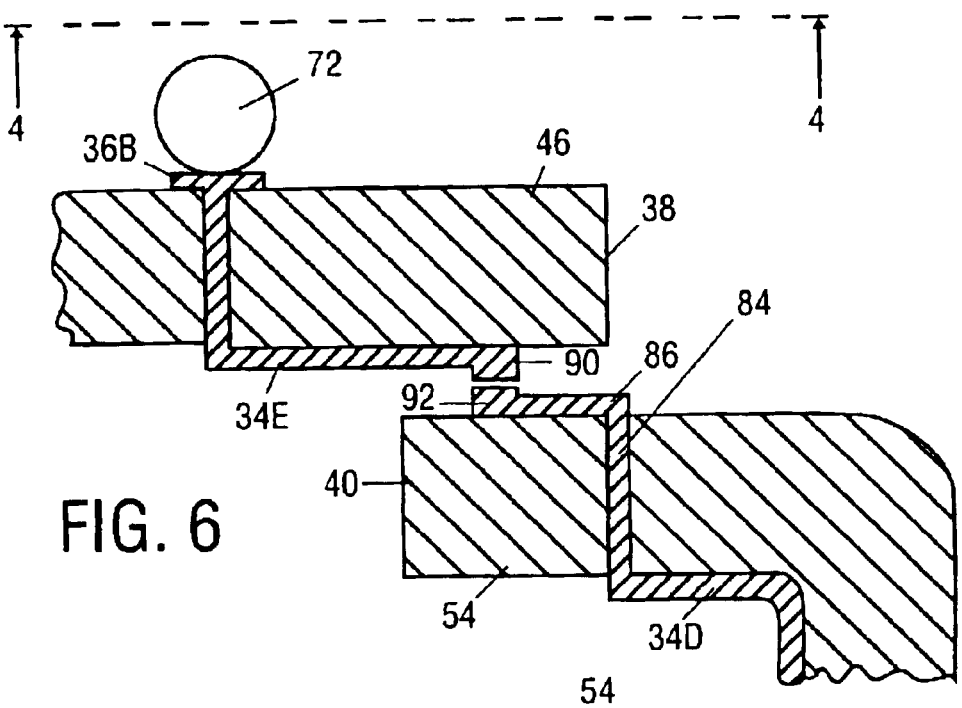
FIG. 6 is a cross-sectional side view illustrating interconnection of a trace on the second mounting portion to a trace on the end portion, according to another embodiment of the invention.

FIG. 6 illustrates a further method according to which, for example, the trace 34D can be connected to the trace 34E. A via 84 is formed through the end portion 54, and a further trace 86 is formed on a side of the end portion 54 opposing the trace 34D. The via 84 interconnects the traces 34D and 86. The end portion 54 is folded so that the trace 86 is on an upper surface thereof. Solder formations 90 and 92 are formed respectively on a lower surface of the second mounting portion 46 and the upper surface of the end portion 54. The solder formations 90 and 92 are located against one another and are ultrasonically bonded to one another.

Figure 7:
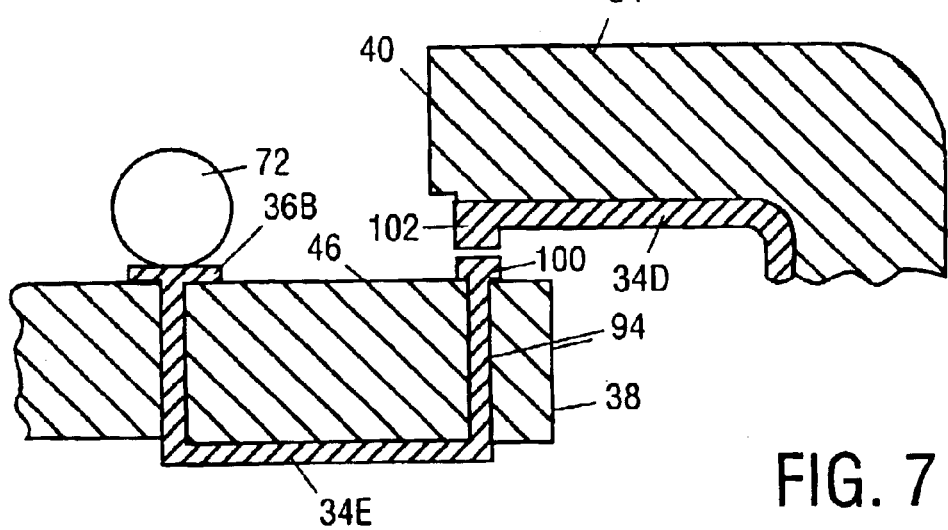
FIG. 7 is a cross-sectional side view illustrating interconnection of a trace on the second mounting portion to a trace on the end portion, according to a further embodiment of the invention.

FIG. 7 illustrates a further method according to which, for example, the trace 34D can be connected to the trace 34E. A further via 94 is formed through the second mounting portion 46. Solder formations 100 and 102 are formed respectively on an upper surface of the second mounting portion 46 and on a lower surface of the end portion 54. The end portion 54 is folded over the second mounting portion 46. The solder formations 100 and 102 are ultrasonically bonded to one another. In another embodiment, the trace 34E may run across an upper surface of the second mounting portion 46 and connect the electric land 36B directly to the solder formation 100, i.e., without the intervening via 94.

Figure 8:
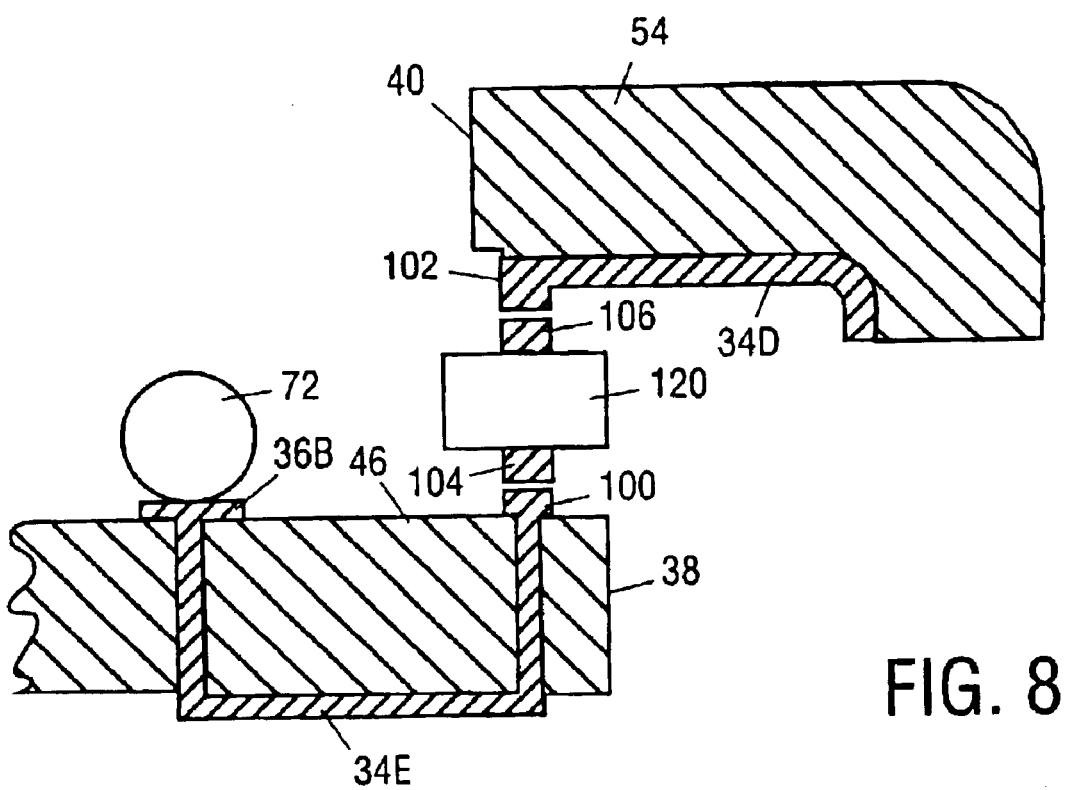
FIG. 8 is a cross-sectional side view illustrating the use of one active or passive component to interconnect a trace on the second mounting portion to a trace on the end portion, according to yet a further embodiment of the invention.

As illustrated in FIG. 8, the traces 34E and 34D may also be interconnected with an active or passive device 120. Device terminals 104 and 106 are formed on lower and upper surfaces of the device 120, respectively. The solder formation 100 can be ultrasonically bonded to the device terminal 104, and the solder formation 102 to the device terminal 106. The device 120 can be used to tailor electrical characteristics of signals in the assembly. The embodiment of FIG. 8 is the same as the embodiment of FIG. 7 in all other respects.

Figure 9:
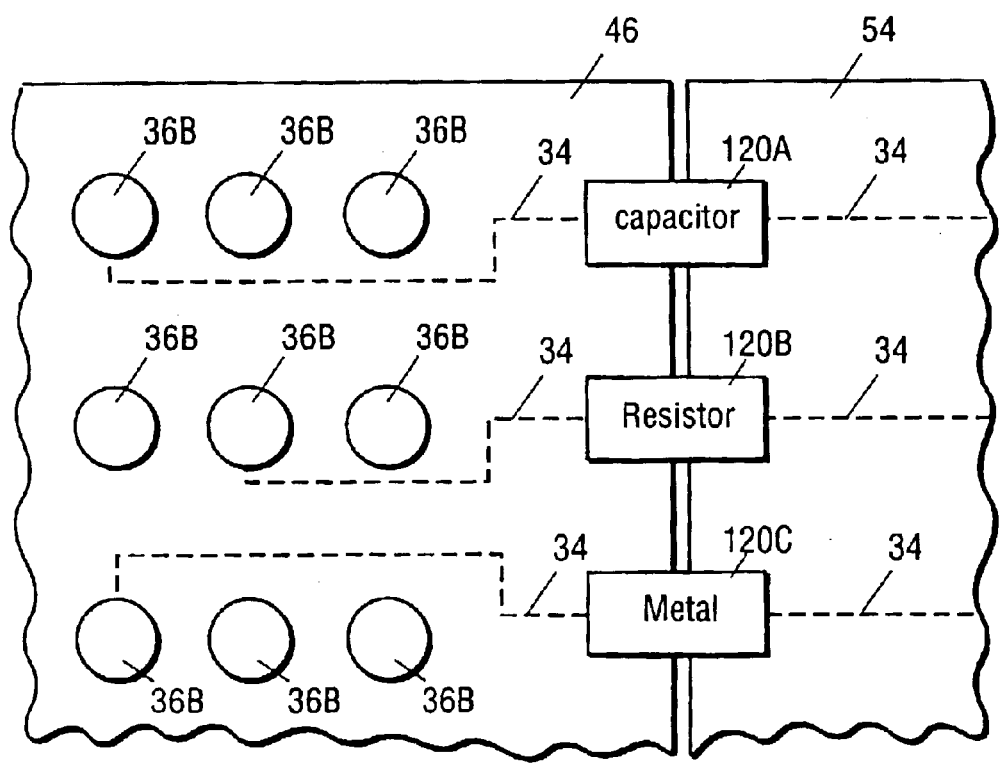
FIG. 9 is a top plan view illustrating somewhat diagrammatically the use of different passive components for interconnecting different traces in the embodiment of FIG. 8.

As illustrated in FIG. 9, a different device 120 can be used to interconnect different ones of the traces 34 on the second mounting portion 46 and the end portion 54. For example, one device 120A may be a capacitor, another device 120B may be a resistor, while a further device 120C may be a metal interconnection. It may also be possible to use active devices instead of passive devices such as capacitors, resistors, and metal interconnectors. It should be understood that the devices 120A, B, and C are illustratively represented in blocks, and that they are in fact sandwiched between the second mounting portion 46 and the end portion 54, as illustrated in FIG. 8.

Figure 10:
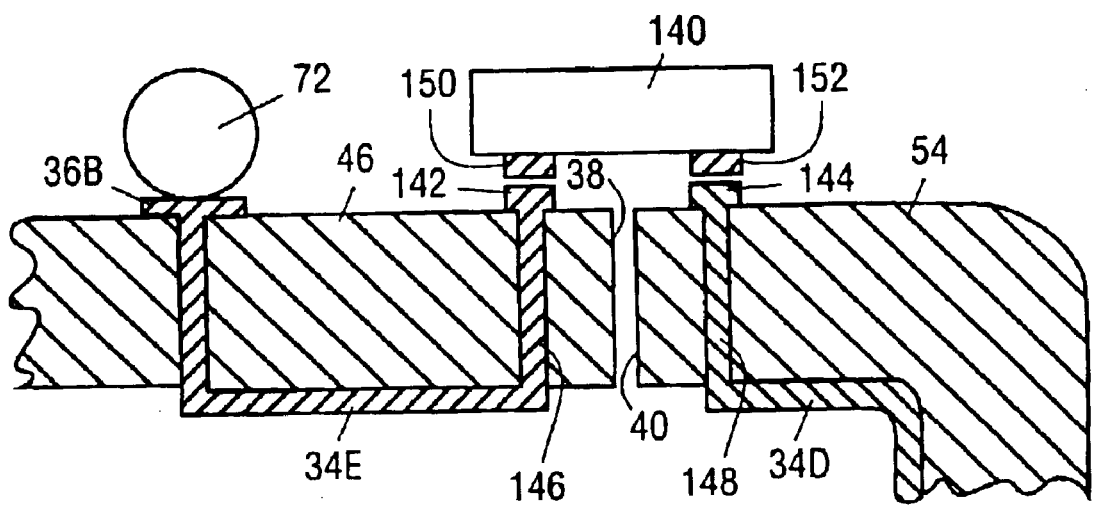
FIG. 10 is a cross-sectional side view illustrating interconnection of traces on the second mounting and end portions, utilizing an active or passive device, according to yet a further embodiment of the invention.

FIG. 10 illustrates a further embodiment, wherein the traces 34D and 34E are interconnected without being sandwiched as illustrated in FIG. 8 with an active or passive device 140. The left and right edges 38 and 40 are located adjacent one another. Solder formations 142 and 144 are formed on upper surfaces of the second mounting portion 46 and the end portion 54, and interconnected through vias 146 and 148 to the traces 34E and 34D, respectively. Device terminals 150 and 152 are formed on a lower side of the device 140. The device terminals 150 and 152 are ultrasonically bonded to the solder formations 142 and 144, respectively.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An electronic package, comprising:
    a flexible substrate having first and second portions with a fold portion between the first and second portions, the flexible substrate being folded at the fold portion to position the second portion over the first portion;
    a first plurality of conductors, each running from the first portion over the fold portion onto the second portion; and
    a second plurality of conductors, each running from the first portion onto the second portion without running over the fold portion.

2. The electronic package of claim 1, wherein each second conductor is formed by connecting first and second sections thereof, on the first and second portions respectively, to one another.

3. The electronic package of claim 1, wherein each first conductor extends to the left along the first portion and subsequently to the right along the second portion, and each second conductor extends to the right along the first portion, and subsequently to the left along the second portion.

4. The electronic package of claim 1, wherein the second conductors run from an edge of the first portion onto an edge of the second portion.

5. The electronic package of claim 4, wherein the first and second portions are between the edges when the flexible substrate is unfolded.

6. The electronic package of claim 1, further comprising:
    a plurality of external terminals on the first portion and connected to the first conductors;
    a plurality of external terminals on the second portion and connected to the first conductors;
    a plurality of external terminals on the first portion and connected to the second conductors; and
    a plurality of external terminals on the second portion and connected to the second conductors.

7. The electronic package of claim 1, wherein each first conductor extends to the left along the first portion and subsequently to the right along the second portion, and each second conductor extends to the right along the first portion, and subsequently to the left along the second portion, and further comprising:
    a plurality of external terminals on the first portion and connected to the first conductors;
    a plurality of external terminals on the second portion and connected to the first conductors;
    a plurality of external terminals on the first portion and connected to the second conductors; and
    a plurality of external terminals on the second portion and connected to the second conductors.

8. The electronic package of claim 7, wherein at least one of the external terminals on the second portion and connected to the second conductors is located to the left of a center line of all the external terminals on the second portion connected to the first and second conductors.

9. The electronic package of claim 8, wherein at least one of the external terminals on the second portion and connected to the first conductors is located to the right of a center line of all the external terminals on the second portion connected to the first and second conductors.

10. The electronic package of claim 1, further comprising:
    a microelectronic device mounted on the first portion and electrically connected to at least some of the first conductors and some of the second conductors.

11. The electronic package of claim 10, further comprising:
    a microelectronic device mounted on the second portion and electrically connected to at least some of the first conductors and some of the second conductors.

12. The electronic package of claim 10, wherein the first microelectronic device is a processor and the second microelectronic device is a memory module.

13. An electronic package, comprising:
    a flexible substrate having first and second portions with a fold portion between the first and second portions, the flexible substrate being folded at the fold portion to position the second portion over the first portion;
    a plurality of external terminals on the first portion;
    a plurality of external terminals on the second portion;
    a first plurality of conductors, each running from a respective external terminal on the first portion to the left along the first portion, over the fold line and subsequently to the right along the second portion to a respective one of the external terminals on the second portion; and
    a second plurality of conductors, each running from a respective external terminal on the first portion to the right along the first portion and subsequently to the left over the second portion without running over the fold portion.

14. The electronic package of claim 13, wherein at least one of the external terminals on the second portion and connected to the second conductors is located to the left of a center line of all the external terminals on the second portion connected to the first and second conductors.

15. The electronic package of claim 14, wherein at least one of the external terminals on the second portion and connected to the first conductors is located to the right of a center line of all the external terminals on the second portion connected to the first and second conductors.

16. The electronic package of claim 13, wherein each second conductor is formed by connecting first and second sections thereof, on the first and second portions respectively, to one another.

17. The electronic package of claim 16, further comprising at least one of a capacitor and a resistor connecting the first section to the second section.

18. The electronic package of claim 16, further comprising a capacitor and a resistor, each connecting a respective first section to a respective second section.

19. The electronic package of claim 13, further comprising:

a microelectronic device mounted on the first portion and electrically connected to at least some of the first conductors and some of the second conductors.

20. A method of constructing an electronic package, comprising:

forming a plurality of first conductors and first and second sections of second conductors on a substrate, the first conductors extending from a first portion on a right-hand side of the substrate over a fold portion to a second portion on a left-hand side of the substrate, the first sections on the first portion and the second sections on the second portion;

folding the substrate at the fold region; and connecting the first and second sections of the second conductors to one another after the substrate is folded at the fold region.

21. The method of claim 20, further comprising:

forming a plurality of external terminals on the first portion connected to the first and second conductors, and on the second portion connected to the first and second conductors.

22. The method of claim 20, wherein at least one of the first sections is connected to at least one of the second sections by at least one of a capacitor and a resistor.

* * * * *